United States Patent [19]

Miller

[11] 4,455,526

[45] Jun. 19, 1984

[54] FET SWITCHING REGULATOR

[75] Inventor: Daniel G. Miller, Randallstown, Md.

[73] Assignee: The United States of America as represented by the Secretary of the Air Force, Washington, D.C.

[21] Appl. No.: 393,265

[22] Filed: Jun. 29, 1982

[51] Int. Cl.³ .............................................. G05F 1/56
[52] U.S. Cl. ................................... 323/282; 323/289; 323/351; 363/86
[58] Field of Search ............... 323/282, 289, 292, 349, 323/351; 363/37, 86, 124

[56] References Cited

U.S. PATENT DOCUMENTS 3,483,464 12/1969 Embree et al. ........................ 323/22
4,203,047 5/1980 Seki .................................. 323/282 X

OTHER PUBLICATIONS

Elektron, Enewickl—Germany.

Primary Examiner—William M. Shoop
Attorney, Agent, or Firm—Donald J. Singer; Bernard E. Franz

[57] ABSTRACT

The high voltage field effect transistor has a drive circuit for pulse width modulation, which includes a small transformer coupled to the gate and source with a diode in series at the gate, so that a very short on-drive pulse charges the gate capacitance, and the charge is held by the diode. Another FET has its output connected between the gate and source of the high voltage FET, and its input coupled to another small transformer so that it is turned on for a short time by a very short off-drive pulse to discharge the gate capacitance and thus turn off the high voltage FET. A transformer drive circuit includes two one-shot devices connected to the pulse width modulator as leading and trailing edge detectors respectively, with their outputs connected via FET's to the on-drive and off-drive transformer primaries respectively, to provide pulses of 100–200 nanoseconds.

8 Claims, 4 Drawing Figures

TYPICAL SWITCHING REGULATOR

FET SWITCHING REGULATOR

RIGHTS OF THE GOVERNMENT

The invention described herein may be manufactured and used by or for the Government of the United States for all governmental purposes without the payment of any royalty.

BACKGROUND OF THE INVENTION

This invention relates to switching mode regulators using pulse width modulation.

Switching regulators have been used for both high and low voltage power supply designs for many years. The circuit includes a series transistor which is switched on and off by a pulse width modulator. Direct coupled drive between the modulator and the switching transistor has been avoided, especially when a three-phase A.C. supply is used, because it requires an isolation transformer for the primary power so that one side of the rectified supply can be grounded. This transformer adds considerable weight and volume to the design and has been avoided in favor of various A.C. coupled designs. While this has proven to be an effective means of reducing weight and volume, the need to reset cores or discharge capacitors has limited the duty cycle to approximately 80%. This increases the peak current requirements of the switches without reducing the voltage requirements and, therefore, limits the power handling capability of available transistors.

New switching regulator designs are now using the recently available high power, high voltage FET's (field effect transistors) in an effort to decrease switching times and increase operating frequencies so that dissipated power, size, and weight can be reduced.

SUMMARY OF THE INVENTION

An object of the invention is to increase the duty cycle of an FET switching regulator to near 100%, so as to increase the power handling capacity of available transistors.

The circuit according to the invention makes use of the high impedance, voltage driven characteristics of FET's to make nearly 100% operation possible with transformer coupling. An on-drive circuit includes a series diode between a transformer winding and the gate of the switching transistor so that a very short drive pulse charges the capacitance at the gate of the switching transistor, the charge being held by the diode. An off drive circuit shunts the switching transistor gate-to-source for a short interval to remove the charge.

This design reduces the power dissipation in the switching transistors, requires no floating power supplies, and allows switching to occur at higher frequencies. Furthermore, this design will allow substantial size and weight reductions of existing and future power supplies.

DETAILED DESCRIPTION

Figure 1:
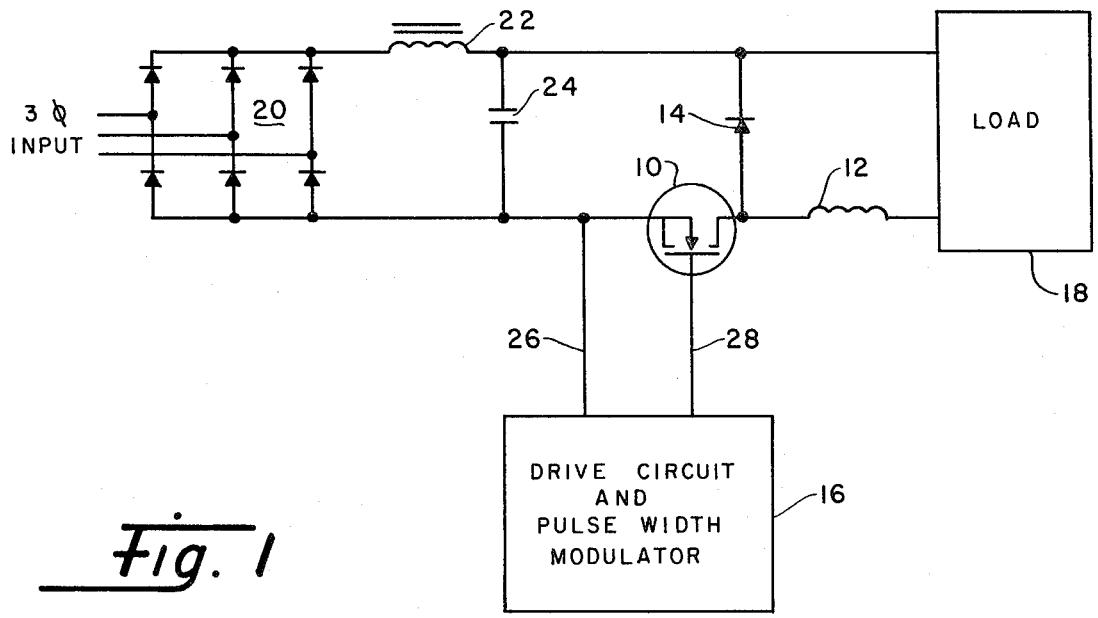
FIG. 1 is a schematic and block diagram of a typical switching regulator.

A typical diagram of a switching regulator without an isolation transformer is shown in FIG. 1. The principal power path of the regulator contains three components, a transistor switch 10, a flyback inductor 12, and a flyback or freewheeling diode 14. A drive circuit and pulse width modulator 16 turns the transistor switch 10 on for a portion of each switching cycle. When the switch 10 is on, energy is stored in the inductor 12 with the diode 14 reverse biased, and when the switch 10 is off the diode 14 becomes forward biased so that energy continues to flow to the load 18. If inductor 12 is sufficiently large, the current flow to the load is substantially constant during the cycle.

The input voltage is obtained from an A.C. source via a rectifier circuit 20 and a filter shown as a series inductor 22 and a shunt capacitor 24. The capacitor 22 serves to maintain a low source impedance at the switching frequency. In some applications an additional filter capacitor may be connected across the load 18. Assuming ideal components in the regulator, the regulated output voltage across the load 18 is equal to the input voltage across capacitor 24 multiplied by the percentage of each switching cycle that the switch 10 is on.

The regulator according to the invention makes use of a high power, high voltage FET. The circuit makes use of the high impedance, voltage driven characteristics of FET's to make near 100% duty operation possible with transformer coupling in the drive circuit. FIG. 1 shows a three-phase input to the rectifier 20, without an isolation transformer. The rectifier 20 comprises six diodes in a full wave configuration. It can be seen that the return of the rectifier cannot be grounded without shorting out half the bridge. This limits the possible rectification to half wave and severely limits the power and ripple performance of the power supply. Therefore, to make use of full wave rectification, the driver to the switcher must be isolated from ground.

Figure 2:
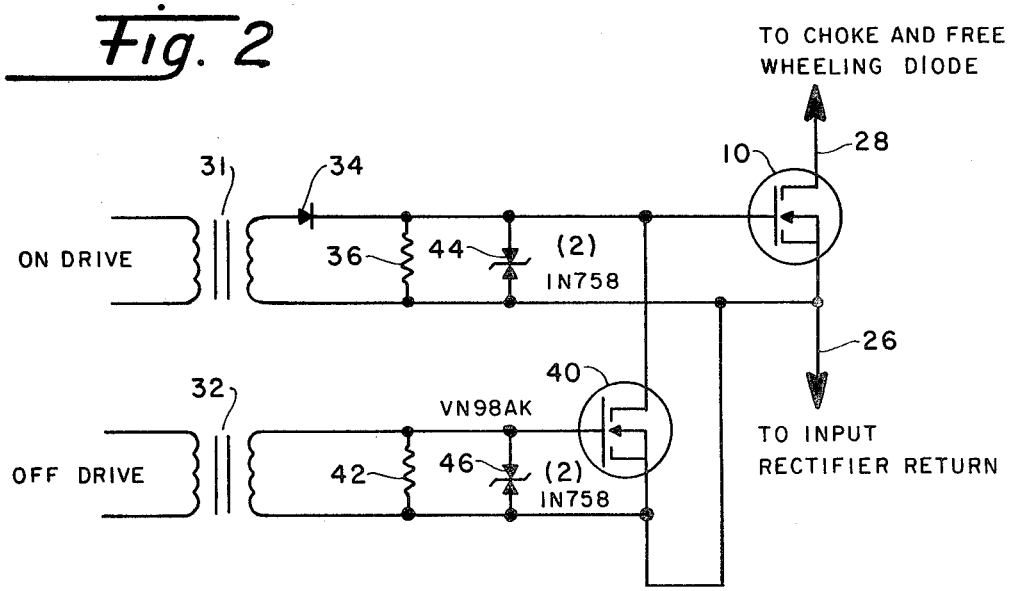
FIG. 2 is a schematic diagram of a drive circuit according to the invention.

The novel circuit to accomplish this for FET's is shown in FIG. 2. The circuit works in the following manner. The 400 volt, 10 ampere FET 10 is turned on with the on-drive pulse via transformer 31 and a 1N4148 type diode 34, which charges the gate-to-source capacitance. The on-drive pulse length is only long enough to provide the necessary charge, approximately 100 nanoseconds. The voltage is then held by the blocking action of the diode 34 and a 5.1 megohm resistor 36 connected between the gate and the source. The resistor 36 and the gate-to-source capacitance provide a long time constant, greater than 500 microseconds.

An off-drive circuit uses a type VN98AK FET 40 having its drain and source connected respectively to the gate and source of FET 10. The secondary of a transformer 32 and a 5100-ohm resistor 42 are connected in paralled from the gate to the source of FET 40. An off-drive pulse via transformer 32 turns on FET 40, which turns off FET 10 by shorting out the gate drive. Again, only a 100-nanosecond pulse length is required to accomplish this. Due to the absence of a blocking diode on the gate of FET 40, it will turn off as soon as the off-drive pulse ends. Because of the short pulse lengths required through the transformers, very high duty operation of the switch at high frequency (up to one megahertz) can be obtained. In fact, if a trigger regeneration circuit is added, the switch can be maintained in the continuous on condition. Note that similar FET drive techniques are used in a different application, as covered by my copending patent application Ser. No. 379,807 filed 1982, for a Universal Control Grid Modulator.

Figure 3:
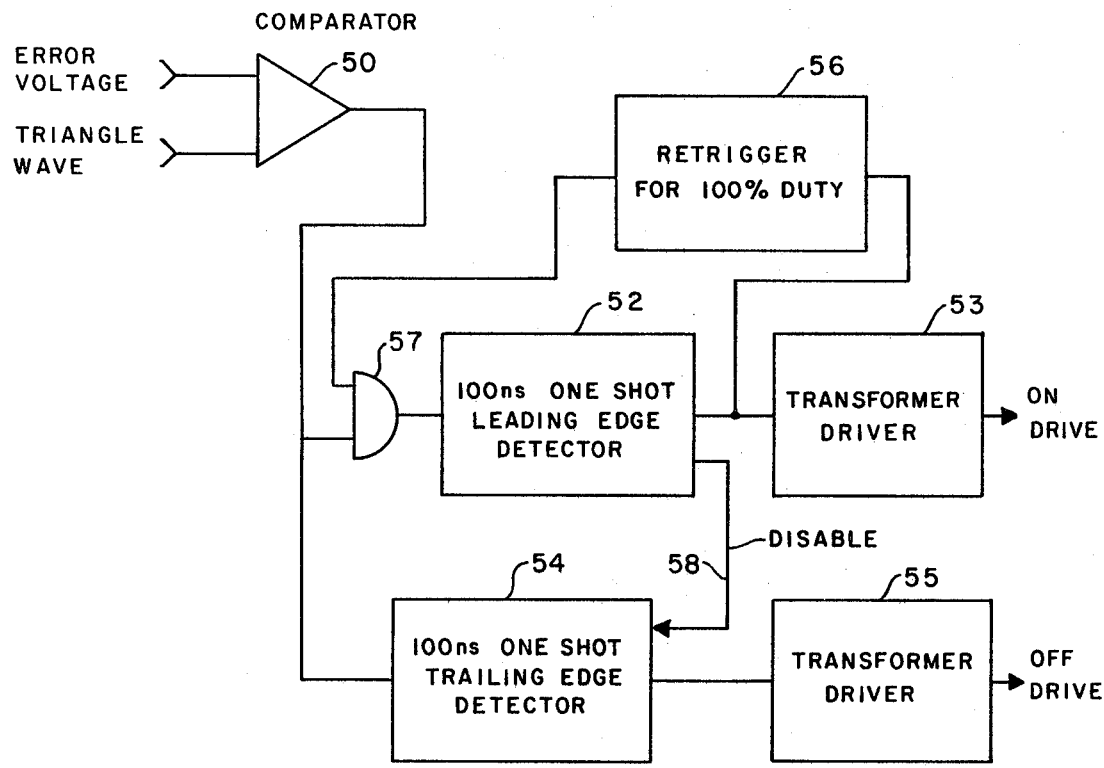
FIG. 3 is a block diagram of a pulse width modulator.

A block diagram of the pulse width modulator and transformer drive circuitry is shown in FIG. 3. The circuitry is an extension of presently used pulse width controllers which compare an error signal with a triangle wave to provide a varying duty drive with line or load. The output of the comparator 50 is further processed through a logic circuit to provide the 100-nanosecond transformer drive pulses. The logic includes two monostable or one-shot devices 52 and 54 with inputs coupled to the comparator. Device 52 is connected as a leading edge detector, and device 54 is connected as a trailing edge detector. The transformer drivers 53 and 54 are amplifiers or switches coupled respectively to the outputs of devices 52 and 54 to provide the on-drive and off-drive pulses to the primary windings of the transformers 31 and 32.

In operation, at the beginning of each cycle the triangle wave goes to a minimum voltage level, and the comparator output is turned on. This triggers one-shot device 52 to supply a 100-ns pulse via driver 53 to transformer 31. The triangle wave increases its level until it equals that of the error voltage, at which time the output of the comparator is turned off to trigger one-shot device 54. This causes a 100ns pulse to be supplied via driver 55 to transformer 32.

As an option, the logic circuitry may also include a retrigger circuit which will provide another on-drive pulse via an AND gate 57 if the comparator output remains high beyond a specified length of time (approximately 60 microseconds). In this case the AND gate 57 also provides the coupling between the comparator output and the input of device 52. The clear pulse via lead 58 from device 52 to the trailing edge detector 54 will prevent the simultaneous generation of on-drive and off-drive pulses.

Advantages of the design:
Applicable to any existing or new power supply using switching regulators.
Allows 100% duty operation of an AC coupled switch.
Permits reduction of Peak currents for equivalent power output of existing designs.
Simplifies drive transformer design.
Reduces Inverter Transformer turns ratio for equivalent output voltage.
Reduces peak currents in inverter stage with no voltage penalty.
Prior techniques to AC couple the drive circuits need to reset cores or discharge capacitors, which has limited the duty cycle to approximately 80%. This leads to output voltages at least 30% below the nominal input voltage, and to a correspondingly higher switching current for a given output power. In turn, this limits the power that can be handled by the switching transistors to about 70% of their capability.

Two articles relating to switching regulators using bipolar transistors, by E. T. Calkin and B. H. Hamilton appear in IEEE Transactions on Inductry Applications, Vol. IA-12, No. 4, July/August 1976. The first article on pages 364–369 is titled "Circuit Techniques for Improving the Switching Loci of Transistor Switches in Switching Regulators", and the second article on pages 369–377 is titled "A Conceptually New Approach for Regulated DC to DC converters Employing Transistor Switches and Pulsewidth Control"Some of the features described in the first article are covered by U.S. Pat. Nos. 3,383,584 3,745,444 and 3,736,495. The features of the first article include a low loss charging circuit and a turnoff loss network (referred to herein as snubbers) to improve the efficiency of the switching transistor 10, flyback diode 14 and flyback inductor 12. Although not shown in FIG. 1, forms of the snubbers were included in an experimental model.

In FIG. 1, a three-phase input was rectified and filtered to yield a 270-volt DC source. This was applied to a 33-ohm load 18 through the regulator. In place of one FET 10, a pair of parallel switching FET's (type IRF 420) and associated snubbing circuits were used. The regulator is capable of providing 2000 watts to the load. The free wheeling or flyback diode 14 was type SVD 450–12, and the inductor 12 has a value of 1.9 millihenries.

Referring to FIG. 2, the off-drive pulse width as originally designed was 100 ns. While this proved to be more than sufficient under no load conditions, a noise pick up problem was encountered when operating with a load. Among other things, the switching transistors were found to develop slower turn-on and turn-off times. Expanding the off-drive pulse length to 200 ns decreased this to a reasonable level. The two back-to-back diodes 44 across the input of FET 10, and the two diodes 46 across the input of FET 40, are 10 volt Zeners type 1N758, and serve only to protect the FET's from transients.

PULSE TRANSFORMER DESIGN

The fact that the maximum pulse width encountered is only 200 ns allows for very small, fast pulse transformers. The volt-second requirement of the transformers in the model (which operates at 40 kilohertz) allows 25 microseconds for resetting the core versus the maximum 0.2 microsecond drive time. Even operating at 300 kHz would give a reset/drive time ratio of better than 10:1. The net result of this is a decrease in the weight and volume of the pulse transformers. They may be wound on torroidal ferrite cores with only one or two turns of No. 22 AWG wire on both the primary and the secondary. The wire for the secondary windings may have high voltage silicon insulation.

PULSE TRANSFORMER DRIVE CIRCUITRY

Figure 4:
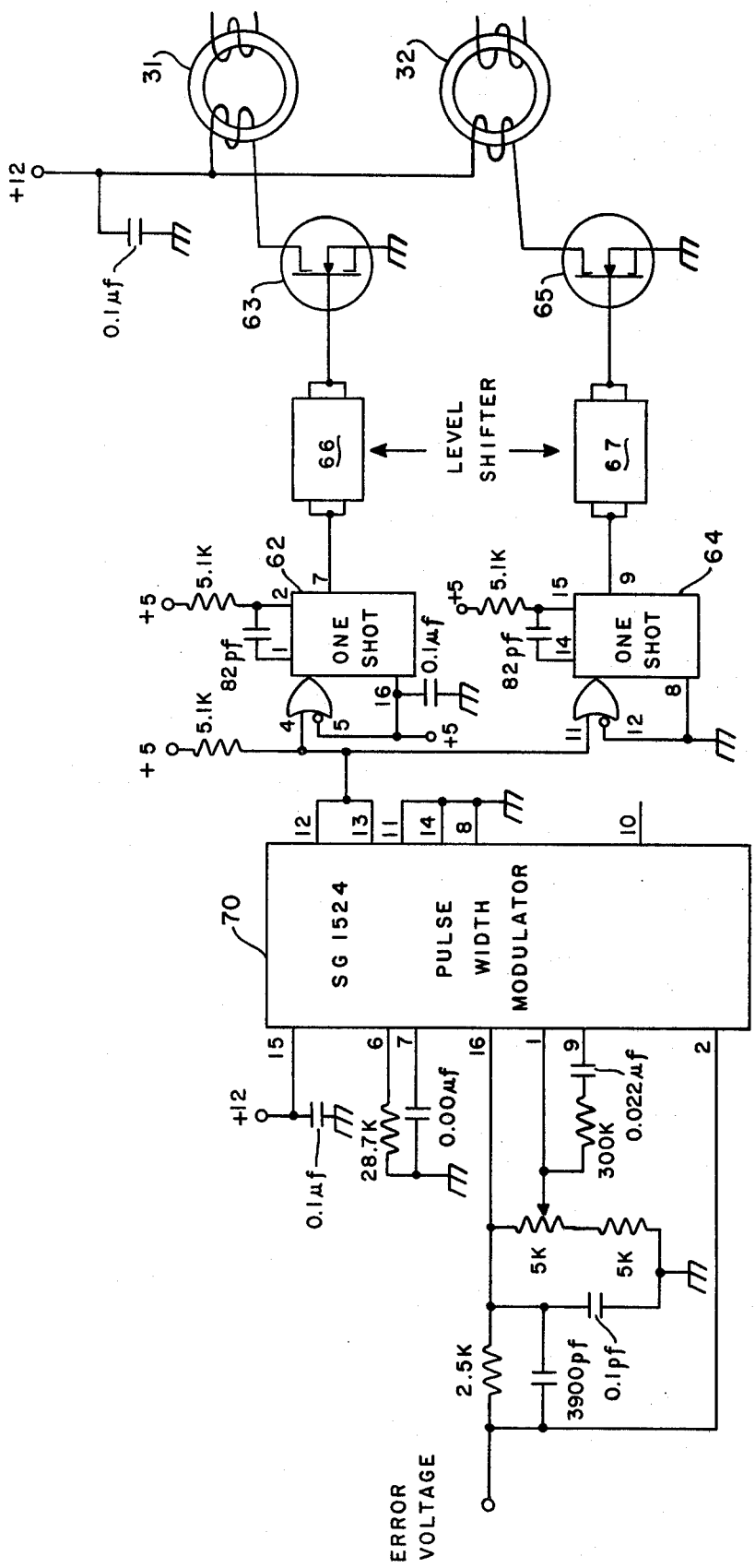
FIG. 4 is a more detailed schematic and functional block diagram of the modulator of FIG. 3.

A more detailed drawing of the drive circuitry of FIG. 3 is shown in FIG. 4. A Fairchild 9602 dual edge triggered one shot was chosen because of its ability to generate the very fast, narrow pulses required to operate the switching transistors and for its enable/disable function. The enable/disable is used to prevent simultaneous generation of on-drive and off-drive pulses. The 9602 one-shot devices 62 and 64 and their bias components form the devices 52 and 54 of FIG. 3.

As the 9602 is a TTL device, it was necessary to provide a TTL-to-CMOS level shifter devices 66 and 67 to drive the pulse transformer drive transistors. The device chosen to meet the speed and power requirements was the RCA 40115. The 9602 and the 40115 met all expectations. There was a problem encountered with the sensitivity of the 40115 to overvoltage transients, however. This was solved with a simple capacitor/Zener diode bypass circuit on the +12 volt supply. The transformer drive devices 63 and 65 are type VN206N2 FET's.

A major saving was brought about by the use of a SG1524 pulse width modulator 70. This device on a single chip comprises a reference regulator, an oscillator, an error amplifier, a current limit amplifier, a comparator, a flip-flop, and a shutdown circuit. The error voltage input signal is supplied via the RC network shown to pins 1, 2, 9 and 16. The output is switched by the flip-flop and gates to pins 12 and 13, with pins 11 and 14 the return. In the present application the outputs are connected in parallel. The RC circuit at pins 6 and 7 determines the switching frequency.

DUTY CYCLE

The circuit of FIG. 3 shows an optional retriggering circuit 56 to provide additional on-drive pulses should the comparator output remain high for an extended period. However, such a circuit is really not needed. In fact, for proper operation, the turn-on snubbing circuit (not shown) has to be allowed a certain minimum time in which to reset for the next cycle. The design of the SG1524 pulse width unit 70 allows for this in that the maximum duty capability at 40 kHz is approximately 97%. This allows sufficient time for the snubbing circuit to operate correctly.

BRIDGE INVERTER

The experimental model also included a bridge inverter following the switching regulator, which is then in effect the load 18. The result is a circuit similar to that shown in FIG. 13 on page 376 of the second Calkin et al article, with the output rectifier omitted to provide AC instead of DC output. The inverter uses four of the high voltage FET's like FET 10 of the regulator. The gate drive circuits are similar to those used for the switching regulator. The same pulse width modulator 70 is used, with the output from pins 12 and 13 driving a flip-flop (type 5473) in parallel with the inputs to devices 62 and 64 of FIG. 4. The Q and Q̄ outputs of the flip-flop respectively drive one shot devices, also type 9602. These are followed by level shifters on the same chip as devices 66 and 67. Since the load on the bridge pulse transformer is twice that of the regulator pulse transformer, it was necessary to use driver FET's which have a somewhat higher power rating than the FET's 63 and 65. To this end, Siliconix type VN64GA type FET's were chosen. The pulses from these devices are supplied via transformer means similar to transformers 31 and 32 to drive circuits similar to that shown in FIG. 2. Four such circuits are used, one for each of the bridge FET's. The bridge was designed to provide 1800 watts of output power at a 20 kHz switching frequency. The development of a high frequency bridge inverter with extremely fast transition times will allow the use of smaller, more efficient inverter transformers, thus further reducing overall power supply weight and volume.

PROTECTION CIRCUITS

One of the protection methods associated with the switching regulator is an over current detector. This detector consists of a 200:1 sense transformer in the regulator return line which is used to detect current surges in excess of some preset maximum. A signal is developed in a circuit from the +12 volt supply via a 225-ohm resistor, a 50-ohm potentiometer, the secondary winding of the sense transformer, and a 250-microhenry inductor to ground. The ungrounded side of the inductor is connected via a 0.1 microfarad capacitor to the input at pin 5 of a type 5473 flip-flop. An output from pin 9 of the flip-flop is connected to pin 10 of the pulse width modulator device 70, to disable it. The modulator is reenabled by resetting the flip-flop.

CONCLUSION

In order to avoid the low duty cycles and high power dissipation of most conventional AC coupled switching regulators, a new regulator design has been built and tested. This design uses the properties of FET's to give high duty cycles at high frequencies with efficiencies well in excess of 90%. Furthermore, the new design simplifies drive transformer design, has no floating power supplies, and is applicable to any current or future power supply. In addition to this, a new FET bridge inverter is being developed which will ultimately allow the use of smaller, more efficient inverter transformers.

Thus, while preferred constructional features of the invention are embodied in the structure illustrated herein, it is to be understood that changes and variations may be made by the skilled in the art without departing from the spirit and scope of my invention.

I claim:

1. A drive circuit for a system using pulse width modulation of a least one field effect transistor which has a source, a gate and a drain, in which the system includes a modulator coupled via said drive circuit to an input between the gate and source, the modulator providing repetitive cycles with variable on and off intervals indicated by discrete on and off levels at a modulator output, said transistor having a gate capacitance which is the internal gate-to-source capacitance;

wherein said drive circuit comprises first and second transformers each having a primary and a secondary winding, the secondary winding of the first transformer having one terminal coupled to said gate and another terminal coupled to said source, with a diode in series directly between said one terminal and the gate, said diode being the only significant circuit element connected between said one terminal and the gate, so that an on-drive pulse applied via the first transformer charges said gate capacitance to bias said field effect transistor on, the charge being held by the diode; a switching device having an output connected directly between said gate and said source and an input connected to the secondary winding of the second transformer, so that an off-drive pulse applied via the second transformer turns on said switching device to thereby discharge said gate capacitance to bias the field effect transistor off:

transformer drive means coupled between said modulator output and said first and second transformer primary winding, including on-control means operative in response to a transition to said on level to apply a very short pulse to the primary winding of the first transformer to provide said on-drive pulse, and including off-control means operative in response to a transition to said off level to apply a very short pulse to the primary winding of the second transformer to provide said off-drive pulse, said very short pulses being substantially less than one microsecond.

2. A drive circuit for a system using pulse width modulation of a least one field effect transistor which has a source, a gate and a drain, in which the system includes a modulator coupled via said drive circuit to an input between the gate and source, the modulator providing repetitive cycles with variable on and off intervals indicated by discrete on and off levels at a modulator outut:

wherein said drive circuit comprises first and second transformers each having a primary and a secondary winding, the secondary winding of the first transformer having one terminal coupled to said gate and another terminal coupled to said source, with a diode in series between said one terminal and the gate, so that an on-drive pulse applied via the first transformer charges the gate capacitance to bias said field effect transistor on, the charge being held by the diode; a switching device having an output connected between said gate and said source and an input connected to the secondary winding of the second transformer, so that an off-drive pulse applied via the second transformer turns on said switching device to thereby discharge the gate capacitance to bias the field effect transistor off;

transformer drive means coupled between said modulator output and said first and second transformer primary winding, including on-control means operative in response to a transition to said on level to apply a very short pulse to the primary winding of the first transformer to provide said on-drive pulse, and including off-control means operative in response to a transition to said off level to apply a very short pulse to the primary winding of the second transformer to provide said off-drive pulse;

wherein said on-control means and off-control means each comprises a one-shot device and a switching device in tandem, with inputs of the one-shot devices coupled to the modulator output as leading-edge and trailing edge detectors respectively.

3. A drive circuit according to claim 2, including a very high value resistance device connected between said gate and said source to provide a very long time constant for discharge of the gate capacitance, and a lower value resistance connected across the secondary winding of the second transformer.

4. A drive circuit according to claim 3, wherein said switching device between the gate and source is a field-effect transistor.

5. A drive circuit according to claim 4, wherein said switching devices of said on-control means and said off-control means are field effect transistors.

6. A drive circuit according to claim 1, 2 or 5 wherein said first and second transformers each are wound on torroidal cores with a very small number of turns on both the primary and the secondary windings.

7. A drive circuit according to claim 1, 2 or 5, wherein said field effect transistor is a high voltage and high power device used as part of a switching regulator, the drive circuit providing a duty cycle which may vary up to nearly 100% on.

8. A drive circuit according to claim 1, including a very high value resistance device connected between said gate and said source to provide a very long time constant (greater than 500 microseconds) for discharge of the gate capacitance, and a lower value resitance connected across the secondary winding of the second transformer.

* * * * *